(12) United States Patent
Kumada et al.

(10) Patent No.: US 10,347,735 B2
(45) Date of Patent: Jul. 9, 2019

(54) SEMICONDUCTOR DEVICE WITH LIFETIME KILLERS AND METHOD OF MANUFACTURING THE SAME

(71) Applicant: Fuji Electric Co., Ltd., Kanagawa (JP)

(72) Inventors: Keishirou Kumada, Nagano (JP); Yuichi Hashizume, Nagano (JP); Yasuyuki Hoshi, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/863,704

(22) Filed: Jan. 5, 2018

(65) Prior Publication Data

US 2018/0233564 A1 Aug. 16, 2018

(30) Foreign Application Priority Data

Feb. 13, 2017 (JP) .................................. 2017-024491

(51) Int. Cl.
*H01L 21/02* (2006.01)
*H01L 21/22* (2006.01)
(Continued)

(52) U.S. Cl.
CPC .. *H01L 29/66068* (2013.01); *H01L 21/02529* (2013.01); *H01L 21/02636* (2013.01);
(Continued)

(58) Field of Classification Search
CPC ........... H01L 29/1058; H01L 29/66893; H01L 29/66916; H01L 29/66931;
(Continued)

(56) References Cited

U.S. PATENT DOCUMENTS 8,222,681 B2 7/2012 Schulze et al.
2001/0001494 A1* 5/2001 Kocon ................ H01L 29/0634
257/328
(Continued)

FOREIGN PATENT DOCUMENTS

JP WO 2016039071 A1 * 3/2016 ....... H01L 21/02378
WO 2016/039071 A1 3/2016
WO WO-2016039071 A1 * 3/2016 ....... H01L 21/02378

OTHER PUBLICATIONS

Shenai et al., "Optimum Semiconductors for High-Power Electronics", IEEE Transactions on Electron Devices, Sep. 1989, vol. 36, No. 9, p. 1811-1823 (Mentioned in paragraph Nos. 4 and 11 of the as-filed specification.).
(Continued)

*Primary Examiner* — Zandra V Smith
*Assistant Examiner* — Jeremy J Joy
(74) *Attorney, Agent, or Firm* — Chen Yoshimura LLP

(57) ABSTRACT

A semiconductor device includes a semiconductor substrate, a first semiconductor layer of a first conductivity type, a second semiconductor layer of a second conductivity type, a first semiconductor region of the first conductivity type, a second semiconductor region of the second conductivity type, a gate insulating film, and a gate electrode. The semiconductor device further includes, in a region of the first semiconductor layer across or adjacent to a p-n junction therein that does not overlap the second semiconductor region in a plan view except lateral edges thereof, a lifetime killer region having lifetime killers implanted therein.

14 Claims, 5 Drawing Sheets

(51) Int. Cl.
*H01L 29/06* (2006.01)
*H01L 29/16* (2006.01)
*H01L 29/167* (2006.01)
*H01L 29/36* (2006.01)
*H01L 29/417* (2006.01)
*H01L 29/423* (2006.01)
*H01L 29/66* (2006.01)
*H01L 29/739* (2006.01)
*H01L 29/78* (2006.01)

(52) U.S. Cl.
CPC ........ *H01L 21/221* (2013.01); *H01L 29/0688* (2013.01); *H01L 29/167* (2013.01); *H01L 29/1608* (2013.01); *H01L 29/36* (2013.01); *H01L 29/41741* (2013.01); *H01L 29/4236* (2013.01); *H01L 29/42356* (2013.01); *H01L 29/66333* (2013.01); *H01L 29/66348* (2013.01); *H01L 29/66712* (2013.01); *H01L 29/66734* (2013.01); *H01L 29/7395* (2013.01); *H01L 29/7397* (2013.01); *H01L 29/7813* (2013.01)

(58) Field of Classification Search
CPC ......... H01L 29/66431; H01L 29/66462; H01L 29/66234–29/66348; H01L 29/7393; H01L 29/7395; H01L 29/66333; H01L 2924/13062; H01L 2924/13064; H01L 2924/13055; H01L 21/221; H01L 29/7397; H01L 29/32; H01L 29/1095; H01L 29/0834; H01L 29/1608; H01L 29/01619; H01L 29/0696; H01L 21/26506
See application file for complete search history.

(56) References Cited

U.S. PATENT DOCUMENTS

| | | | | |
|---|---|---|---|---|
| 2007/0231973 | A1* | 10/2007 | Ruething | H01L 29/0834 438/133 |
| 2009/0283799 | A1* | 11/2009 | Ruething | H01L 29/0834 257/143 |
| 2011/0101416 | A1* | 5/2011 | Schulze | H01L 29/0834 257/139 |
| 2013/0075783 | A1* | 3/2013 | Yamazaki | H01L 21/263 257/139 |
| 2013/0134478 | A1* | 5/2013 | Nakajima | H01L 29/7395 257/139 |
| 2015/0102363 | A1* | 4/2015 | Tanaka | H01L 21/046 257/77 |
| 2015/0311279 | A1* | 10/2015 | Onozawa | H01L 29/66333 257/139 |
| 2016/0315140 | A1* | 10/2016 | Iwasaki | H01L 29/32 |
| 2016/0336390 | A1* | 11/2016 | Hamada | H01L 29/66068 |
| 2017/0012102 | A1* | 1/2017 | Konrath | H01L 29/32 |
| 2017/0018434 | A1* | 1/2017 | Onozawa | H01L 21/3003 |
| 2017/0025524 | A1* | 1/2017 | Kinoshita | H01L 21/02378 |
| 2017/0373141 | A1* | 12/2017 | Yoshida | H01L 21/8234 |

OTHER PUBLICATIONS

Baliga "Silicon Carbide Power Devices", World Scientific, Jan. 2006, pp. 61-68.

* cited by examiner

SEMICONDUCTOR DEVICE WITH LIFETIME KILLERS AND METHOD OF MANUFACTURING THE SAME

BACKGROUND OF THE INVENTION

Technical Field

The present invention relates to a semiconductor device and a method of manufacturing the semiconductor device.

Background Art

Silicon (Si) has conventionally been used as the material for power semiconductor devices for controlling high voltages and high currents. There are various types of power semiconductor devices, such as bipolar transistors, insulated-gate bipolar transistors (IGBTs), and metal-oxide-semiconductor field-effect transistors (MOSFETs), and these devices are respectively used according to the purposes.

For example, bipolar transistors and IGBTs offer higher current densities than MOSFETs and make it possible to work with higher currents but cannot be switched at high speeds. More specifically, bipolar transistors are limited to being used at switching frequencies on the order of several kHz, and IGBTs are limited to being used at switching frequencies on the order of several dozen kHz. Power MOSFETs, on the other hand, have lower current density than bipolar transistors and IGBTs and make it difficult to work with high currents but can be operated at high switching speeds on the order of several MHz.

However, there is strong commercial demand for power semiconductor devices that can both handle large currents and offer good high-speed performance. Much effort has been made on improving IGBTs and power MOSFETs, and currently, these devices have been developed to near the performance limits of the materials being used. There is various ongoing research on semiconductor materials that can replace silicon in power semiconductor devices, and silicon carbide (SiC) has attracted attention as a semiconductor material that could potentially make it possible to manufacture next-generation power semiconductor devices with low on-voltages and excellent high-speed and high-temperature performance (see Non-Patent Document 1).

The reasons behind this include that SiC is an exceptionally chemically stable material having a wide bandgap of 3 eV, and can be used as a semiconductor in an extremely stable manner even at high temperatures. Moreover, the maximum electric field strength is greater than that of silicon by at least an order of magnitude. Due to the substantial possibilities for SiC in terms of exceeding the limits of silicon as a material, it is highly expected that SiC will see increased use in power semiconductors in the future, particularly in MOSFETs. In particular, although it is expected that SiC will offer low ON-resistance, it can also be anticipated that vertical SiC MOSFETs will achieve even lower ON-resistance while maintaining high breakdown voltage properties.

FIG. 10 is a cross-sectional view illustrating the configuration of a conventional vertical SiC MOSFET. As illustrated in FIG. 10, an n-type silicon carbide epitaxial layer 2 is deposited onto the front surface of an $n^+$ silicon carbide substrate 1, and a p-type base layer 3 is selectively formed in the surface of the n-type silicon carbide epitaxial layer 2. An $n^+$ source region 4 and a $p^+$ contact region 5 are selectively formed in the surface of the p-type base layer 3. A gate electrode 7 is formed on the surface between the p-type base layer 3 and the $n^+$ source region 4, with a gate insulating film 6 interposed therebetween. Moreover, a source electrode 8 is formed on the surfaces of the n-type silicon carbide epitaxial layer 2, the $p^+$ contact region 5, and the $n^+$ source region 4. Furthermore, a drain electrode 9 is formed on the rear surface of the $n^+$ silicon carbide substrate 1.

In the MOSFET structure illustrated in FIG. 10, when a positive voltage relative to the source electrode 8 is applied to the drain electrode 9 and a voltage equal to or less than a gate threshold value Vth is applied to the gate electrode 7, the p-n junction between the p-type base layer 3 and the n-type silicon carbide epitaxial layer 2 becomes reverse-biased, and as a result current does not flow. On the other hand, when a voltage greater than or equal to the gate threshold value Vth is applied to the gate electrode 7, current flows due to the formation of an n-type inversion layer (channel) in the surface of the p-type base layer 3 directly beneath the gate electrode 7, and therefore the MOSFET can be switched ON and OFF in accordance with the voltage applied to the gate electrode 7. While the MOSFET is OFF, applying a high voltage to the source electrode 8 makes it possible to drive a built-in p-n (PIN) diode constituted by the p-type base layer 3, the $n^+$ silicon carbide substrate 1, and the n-type silicon carbide epitaxial layer 2.

In addition, there are technologies in which a lifetime killer which serves as recombination centers for minority carriers is introduced into the entire interface between an n-type semiconductor layer and the bottom surface of a p-type base layer in order to eliminate minority carriers when the built-in p-n diode switches OFF and thereby reduce the reverse recovery loss of the built-in p-n diode (see Patent Document 1 below, for example).

RELATED ART DOCUMENTS

Patent Document

Patent Document 1: WO 2016/039071

Non-Patent Document

Non-Patent Document 1: K. Shenai et al., "Optimum Semiconductors for High-Power Electronics", IEEE Transactions on Electron Devices, September 1989, Vol. 36, No. 9, p. 1811-1823

SUMMARY OF THE INVENTION

Here, when a high voltage is applied to the source electrode 8 to drive the built-in p-n diode, current flows through the built-in p-n diode (as illustrated by A in FIG. 10, for example). At this time, in the SiC MOSFET, the forward voltage Vf of the built-in p-n diode satisfies Vf>Vth, and therefore in some cases current passes directly beneath the gate electrode 7 and flows through the p-n junction between the p-type base layer 3 and the n-type silicon carbide epitaxial layer 2 (as illustrated by B in FIG. 10, for example). This current causes carriers to be injected into the $n^+$ silicon carbide substrate 1 and the n-type silicon carbide epitaxial layer 2, thereby making it easier for current to flow. This, in turn, increases the degree of variation in conductivity and makes crystal defects more likely to occur. These crystal defects cause ON-resistance to increase and also cause the threshold voltage Vth of the MOSFET as well as the forward voltage Vf of the built-in p-n diode to fluctuate.

The present invention was made to solve such problems in the conventional technology described above and aims to provide a semiconductor device which makes it possible to reduce formation of crystal defects when applying a high voltage to a source electrode to drive a built-in p-n diode, and a method of manufacturing such semiconductor device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides: a semiconductor device, including: a semiconductor substrate of a first conductivity type; a first semiconductor layer of the first conductivity type formed on a front surface of the semiconductor substrate and having a lower impurity concentration than the semiconductor substrate; a second semiconductor layer of a second conductivity type selectively formed in a surface layer of the first semiconductor layer on a side opposite to a side of the semiconductor substrate; a first semiconductor region of the first conductivity type selectively formed in a surface layer of the second semiconductor layer on a side opposite to the semiconductor substrate side; a second semiconductor region of the second conductivity type selectively formed in the surface layer of the second semiconductor layer on the side opposite to the semiconductor substrate side and having a higher impurity concentration than the second semiconductor layer; a gate electrode formed on a face of a region of the second semiconductor layer that is sandwiched between the first semiconductor layer and the first semiconductor region, with a gate insulating film interposed therebeneath; a first electrode formed on surfaces of the second semiconductor region and the first semiconductor region; a second electrode formed on a rear surface of the semiconductor substrate; and a lifetime killer region that has lifetime killers implanted therein and that is selectively formed in a region of the first semiconductor layer that crosses or is adjacent to a p-n junction formed by the first semiconductor layer of the first conductivity type and a region of the second conductivity type created therein, the lifetime killer region not substantially overlapping the second semiconductor region in a plan view except lateral edges thereof.

In the above-mentioned semiconductor device, the face of the region of the second semiconductor layer that is sandwiched between the first semiconductor layer and the first semiconductor region may be a horizontal surface that is flush with a top surface of the first semiconductor layer, and the p-n junction may be defined by an interface between the first semiconductor layer and the second semiconductor layer.

The above-mentioned semiconductor device may further include a trench going through the second semiconductor layer and reaching the first semiconductor layer, a vertical sidewall of the trench exposing the face of the region of the second semiconductor layer that is sandwiched between the first semiconductor layer and the first semiconductor region, wherein the gate electrode is formed inside the trench across the face of the region of the second semiconductor layer with the gate insulating film interposed therebetween, and wherein the p-n junction is defined by an interface between the first semiconductor layer and a third semiconductor region of the second conductivity that is formed to extend downwardly into the first semiconductor layer from a bottom of the second semiconductor layer and that has a higher impurity concentration than the second semiconductor layer.

In the above-mentioned semiconductor device, the lifetime killer region may be formed in a region of the first semiconductor layer that faces the gate insulating film, and an upper boundary of the lifetime killer region may be positioned further towards a side of the gate insulating film than a bottom of the second semiconductor layer that contacts the first semiconductor layer.

In the above-mentioned semiconductor device, a bottom of the lifetime killer region may be positioned further towards the semiconductor substrate side than an interface between the first semiconductor layer and the second semiconductor layer.

Moreover, in the above-mentioned semiconductor device, the bottom of the lifetime killer region may contact the semiconductor substrate. Furthermore, an upper boundary of the lifetime killer region may be positioned at an interface between the first semiconductor layer and the gate insulating film.

In the above-mentioned semiconductor device, the lifetime killer region includes helium or protons.

In another aspect, the present disclosure provides a method of manufacturing a semiconductor device, including: forming, on a front surface of a semiconductor substrate of a first conductivity type, a first semiconductor layer of the first conductivity type and having a lower impurity concentration than the semiconductor substrate; selectively forming a second semiconductor layer of a second conductivity type in a surface layer of the first semiconductor layer on a side opposite to a side of the semiconductor substrate; selectively forming a first semiconductor region of the first conductivity type in a surface layer of the second semiconductor layer on a side opposite to the semiconductor substrate side; selectively forming a second semiconductor region of the second conductivity type and having a higher impurity concentration than the second semiconductor layer in the surface layer of the second semiconductor layer on the side opposite to the semiconductor substrate side; forming a gate electrode on a face of a region of the second semiconductor layer that is sandwiched between the first semiconductor layer and the first semiconductor region, with a gate insulating film interposed therebetween; forming a first electrode on surfaces of the second semiconductor region and the first semiconductor region; and forming a lifetime killer region by selectively implanting lifetime killers in a region of the first semiconductor layer that crosses or is adjacent to a p-n junction formed by the first semiconductor layer of the first conductivity type and a region of the second conductivity type created therein, the lifetime killer region not substantially overlapping the second semiconductor region in a plan view except lateral edges thereof.

The above-mentioned method of manufacturing the semiconductor device may further include, after forming the second semiconductor region and before forming the gate electrode: forming a trench going through the second semiconductor layer and reaching the first semiconductor layer, a vertical sidewall of the trench exposing the face of the region of the second semiconductor layer that is sandwiched between the first semiconductor layer and the first semiconductor region, wherein in forming the gate electrode, the gate electrode is formed inside the trench across the face of the region of the second semiconductor layer with the gate insulating film interposed therebetween, and wherein the p-n junction is defined by an interface between the first semiconductor layer and a third semiconductor region of the second conductivity that is formed to extend downwardly into the first semiconductor layer from a bottom of the second semiconductor layer and that has a higher impurity concentration than the second semiconductor layer.

According to the present embodiments, a lifetime killer region having implanted therein a lifetime killer which serves as a recombination center for minority carriers is formed. Therefore, when a high voltage is applied to the source electrode to drive the built-in p-n diode, the current that passes directly beneath the gate electrode and flows through the p-n junction between the p-type base layer (the second semiconductor layer of the second conductivity type) and the n-type silicon carbide epitaxial layer (the first semiconductor layer of the first conductivity type) is reduced, thereby making it possible to reduce formation of crystal defects in the n$^+$ silicon carbide substrate (the semiconductor substrate of the first conductivity type) and the n-type silicon carbide epitaxial layer. As a result, the ON-resistance of the semiconductor device does not increase due to such crystal defects, which makes it possible to reduce fluctuations in the threshold voltage Vth of the MOSFET and the forward voltage Vf of the built-in p-n diode and also makes it possible to maintain the reliability of the semiconductor device.

The semiconductor device and method of manufacturing the semiconductor device according to the present embodiments make it possible to reduce formation of crystal defects when applying a high voltage to a source electrode to drive a built-in p-n diode.

It is to be understood that both the foregoing general description and the following detailed description are exemplary and explanatory, and are intended to provide further explanation of the invention as claimed.

DETAILED DESCRIPTION OF EMBODIMENTS

Figure 1:
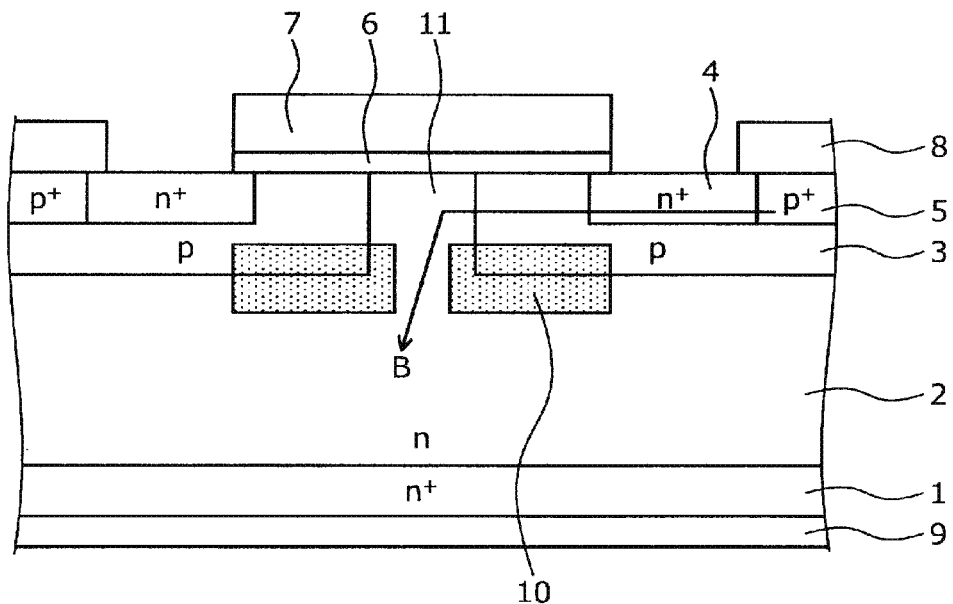
FIG. 1 is a cross-sectional view illustrating the structure of a silicon carbide semiconductor device according to an embodiment.

Preferred embodiments of a semiconductor device and a method of manufacturing the semiconductor device according to the present invention will be described in detail below with reference to the attached drawings. In the present specification and the attached drawings, layers or regions with the letters "n" and "p" are used to indicate whether the majority carriers in the layer or region are electrons or holes, respectively. Moreover, the superscripts + and − are appended to the letters n and p to indicate that layers or regions have a higher impurity concentration or lower impurity concentration, respectively, than layers or regions in which the + and − superscripts are not appended. Layers and regions that are labeled with the same n and p (including + and −) notation have approximately the same impurity concentration but are not limited to having exactly the same impurity concentration. Moreover, in the following descriptions of the embodiments and the attached drawings, the same reference characters are used to indicate components that are the same, and redundant descriptions of such components will be omitted. Furthermore, in the Miller index notation used in the present specification, the symbol — indicates a bar to be applied to the immediately following index; that is, the symbol — is inserted before an index to indicate that that index is negative.

Embodiments

A semiconductor device according to the present embodiments is made using a wide-bandgap semiconductor which has a wider bandgap than silicon. In the embodiments, a silicon carbide semiconductor device manufactured using silicon carbide (SiC), for example, as the wide-bandgap semiconductor will be described using a vertical planar-gate MOSFET as an example. FIG. 1 is a cross-sectional view illustrating a configuration of the silicon carbide semiconductor device according to an embodiment.

As illustrated in FIG. 1, in the silicon carbide semiconductor device according to the embodiment, an n-type silicon carbide epitaxial layer (a first semiconductor layer of a first conductivity type) 2 is deposited onto a principal surface (the front surface) of an n$^+$ silicon carbide substrate (a semiconductor substrate of the first conductivity type) 1.

The n$^+$ silicon carbide substrate 1 is a monocrystalline silicon carbide substrate doped with nitrogen (N), for example. The n-type silicon carbide epitaxial layer 2 is a low impurity concentration n-type drift layer doped with nitrogen, for example, and having a lower impurity concentration than the n$^+$ silicon carbide substrate 1. In the following description, the n$^+$ silicon carbide substrate 1 by itself or the combination of the n$^+$ silicon carbide substrate 1 and the n-type silicon carbide epitaxial layer 2 will be referred to as a "silicon carbide semiconductor substrate".

As illustrated in FIG. 1, in the silicon carbide semiconductor device according to the embodiment, a drain electrode (a second electrode) 9 is formed on the surface of the n$^+$ silicon carbide substrate 1 (which serves as a drain region) on the side opposite to the n-type silicon carbide epitaxial layer 2 side (that is, on the rear surface of the silicon carbide semiconductor substrate). A drain electrode pad (not illustrated in the figure) for connection to an external device is also provided.

A metal-oxide-semiconductor (MOS) insulated gate structure (device structure) is formed on the front surface side of the silicon carbide semiconductor substrate. More specifically, a p-type base layer (a second semiconductor layer of a second conductivity type) 3 is selectively formed in the surface layer of the n-type silicon carbide epitaxial layer 2 on the side opposite to the n$^+$ silicon carbide substrate 1 side (that is, on the front surface side of the silicon carbide semiconductor substrate). The p-type base layer 3 is doped with aluminum (Al), for example.

An n⁺ source region (a first semiconductor region of the first conductivity type) 4 and a p⁺ contact region (a second semiconductor region of the second conductivity type) 5 are formed in the surface of the p-type base layer 3. Moreover, the n⁺ source region 4 and the p⁺ contact region 5 contact one another. The n⁺ source region 4 is arranged around the outer periphery of the p⁺ contact region 5.

Furthermore, an n-type junction FET (JFET) region 11 which goes through the p-type base layer 3 in the depth direction and reaches the n-type silicon carbide epitaxial layer 2 is formed in a portion of the p-type base layer 3 above the n-type silicon carbide epitaxial layer 2. Together, the JFET region 11 and the n-type silicon carbide epitaxial layer 2 form a drift region. A gate electrode 7 is formed on the surface of the portion of the p-type base layer 3 sandwiched between the n⁺ source region 4 and the JFET region 11, with a gate insulating film 6 interposed therebetween. The gate electrode 7 may also be formed on the surface of the JFET region 11 with the gate insulating film 6 interposed therebetween.

Although FIG. 1 depicts only a single MOS structure, a plurality of these MOS structures may be arranged in parallel.

An interlayer insulating film (not illustrated in the figure) is formed over the entire front surface side of the silicon carbide semiconductor substrate so as to cover the gate electrode 7. A source electrode (a first electrode) 8 contacts the n⁺ source region 4 and the p⁺ contact region 5 via contact holes formed in the interlayer insulating film. The source electrode 8 is electrically insulated from the gate electrode 7 by the interlayer insulating film. An electrode pad (not illustrated in the figure) is formed on top of the source electrode 8.

Here, lifetime killer regions 10 are formed near regions facing the gate insulating film 6. The width of the lifetime killer region 10 may be increased on the JFET region 11 side. Increasing the width on the JFET region 11 side makes it possible to reduce the width of the current path for which lifetime is not decreased (B in FIG. 1, for example). The width of the lifetime killer region 10 may also be increased on the n⁺ source region 4 side. However, it is preferable that the lifetime killer region 10 not be present in the region facing the p⁺ contact region 5 in the depth direction because this would increase the forward voltage Vf of the built-in p-n diode. The surface of the lifetime killer region 10 (that is, the surface on the gate side) contacts the interface between the n-type silicon carbide epitaxial layer 2 and the p-type base layer 3 or is positioned further towards the gate side than this interface. However, it is preferable that the lifetime killer region 10 not be formed directly beneath the gate insulating film 6, where the channel forms. Moreover, although it is preferable that the lifetime killer region 10 be configured so as to include the interface between the n-type silicon carbide epitaxial layer 2 and the p-type base layer 3, this interface does not necessarily need to be included. In other words, the lifetime killer region 10 may be formed only on the gate side of the interface between the n-type silicon carbide epitaxial layer 2 and the p-type base layer 3. Furthermore, the lifetime killer region 10 may be formed within the n-type silicon carbide epitaxial layer 2 so as to contact the p-type base layer 3. In addition, it is also preferable that the bottom surface of the lifetime killer region 10 contact the n⁺ silicon carbide substrate 1.

The lifetime killer region 10 is a region in which a lifetime killer which serves as recombination centers for minority carriers is implanted. Here, the lifetime killer is lattice defects formed using protons (H⁺) or helium (He), for example. Alternatively, the lifetime killer may be an element that reduces lifetime, such as gold (Au) or platinum (Pt).

This lifetime killer region 10 reduces the number of minority carriers and thereby reduces the current that passes directly beneath the gate electrode 7 and flows through the p-n junction between the p-type base layer 3 and the n-type silicon carbide epitaxial layer 2 (illustrated by B in FIG. 1, for example).

Figure 2:
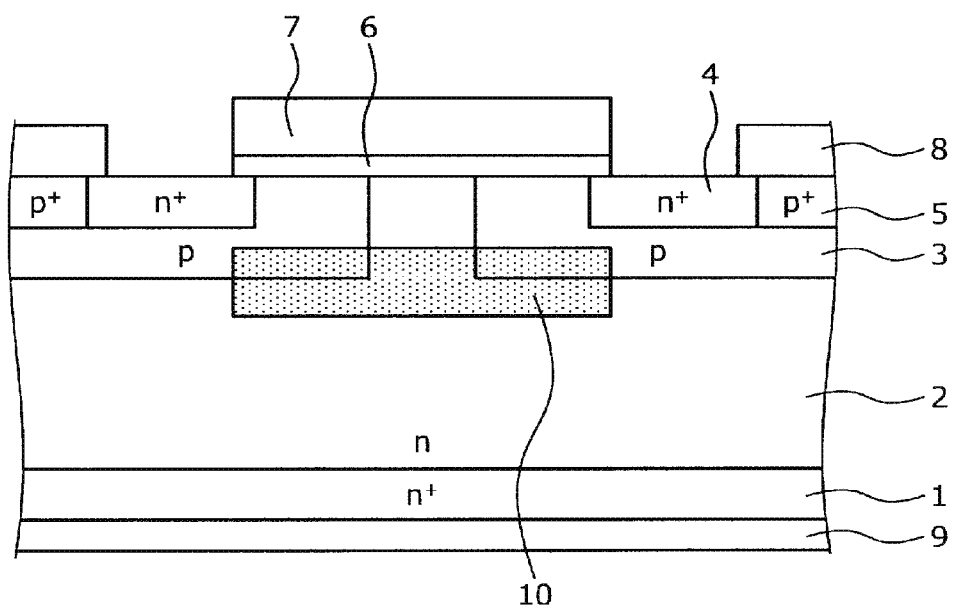
FIG. 2 is a first cross-sectional view illustrating another structure for a lifetime killer region.
Figure 3:
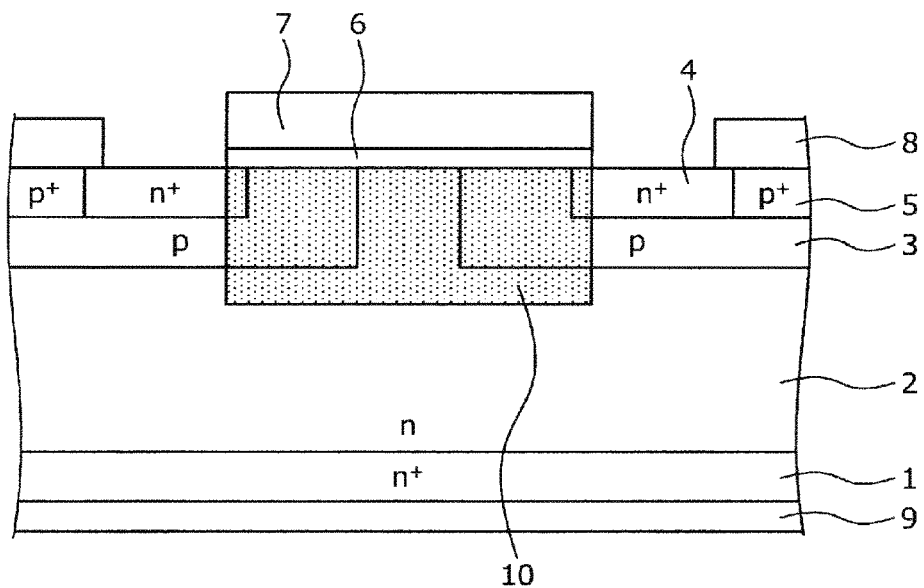
FIG. 3 is a second cross-sectional view illustrating another structure for the lifetime killer region.

FIGS. 2 and 3 are cross-sectional views illustrating other structures for the lifetime killer region. As illustrated in FIG. 2, the lifetime killer region 10 may be formed in a region facing the gate insulating film 6. In FIG. 2, the width is increased further towards the JFET region 11 side than in FIG. 1, and the adjacent lifetime killer regions 10 are connected together. This makes the lifetime killer region 10 wider, thereby making it possible to further reduce the current flowing through the p-n junction between the p-type base layer 3 and the n-type silicon carbide epitaxial layer 2.

Moreover, as illustrated in FIG. 3, the surface of the lifetime killer region 10 may be at the same position as the front surface of the n-type silicon carbide epitaxial layer 2. This makes the lifetime killer region 10 even larger, thereby making it possible to reduce the current flowing through the p-n junction between the p-type base layer 3 and the n-type silicon carbide epitaxial layer 2 to a greater extent than in the case illustrated in FIG. 2. Furthermore, although in this case the region through which current flows when the MOSFET is ON is also included within the lifetime killer region 10, the lifetime killer only reduces the number of minority carriers and therefore does not significantly affect the current that flows when the MOSFET is ON.

(Method of Manufacturing Silicon Carbide Semiconductor Device According to Embodiments)

Figure 4:
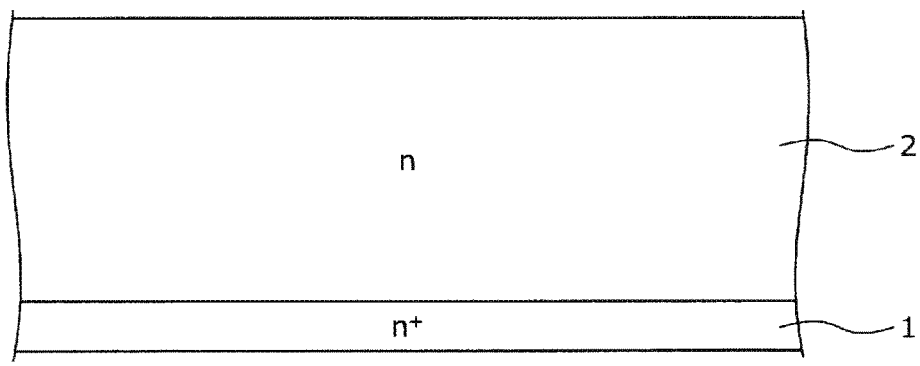
FIG. 4 is a cross-sectional view illustrating a first state during manufacture of the silicon carbide semiconductor device according to the embodiment.

Next, a method of manufacturing the silicon carbide semiconductor device according to the embodiments will be described using an example of manufacturing a MOSFET in the 1200 V breakdown voltage class, for example. FIGS. 4 to 7 are cross-sectional views illustrating states during manufacture of the silicon carbide semiconductor device according to the embodiments. First, an n⁺ silicon carbide substrate 1 doped with nitrogen to an impurity concentration of approximately $2 \times 10^{19}/cm^3$, for example, is prepared. The principal surface of the n⁺ silicon carbide substrate 1 may be a (000-1) plane having an off-angle of approximately 4° in the <11-20> direction, for example. Next, an n-type silicon carbide epitaxial layer 2 doped with nitrogen to an impurity concentration of $1.0 \times 10^{16}/cm^3$ and having a thickness of approximately 10 μm is grown on this (000-1) plane of the n⁺ silicon carbide substrate 1. FIG. 4 illustrates the resulting structure at this point.

Figure 5:
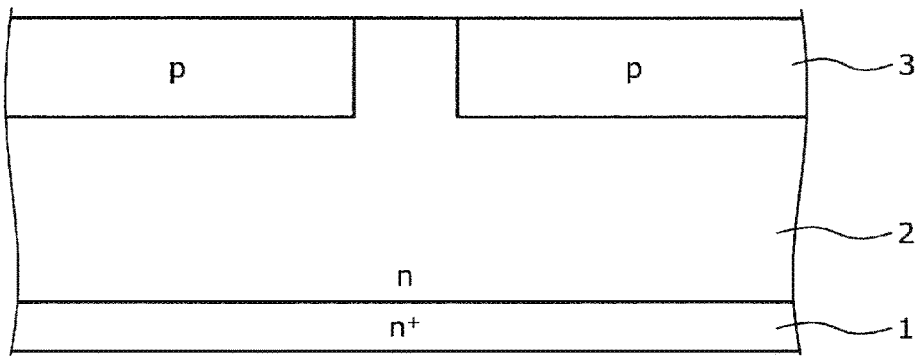
FIG. 5 is a cross-sectional view illustrating a second state during manufacture of the silicon carbide semiconductor device according to the embodiment.

Next, an oxide film mask for ion implantation is formed using photolithography and etching, and a p-type base layer 3 is selectively formed in the surface layer of the n-type silicon carbide epitaxial layer 2 using ion implantation. In this ion implantation process, aluminum may be used as the dopant and the dose may be set such that the p-type base layer 3 takes an impurity concentration of $2.0 \times 10^{16}/cm^3$, for example. FIG. 5 illustrates the resulting structure at this point.

Figure 6:
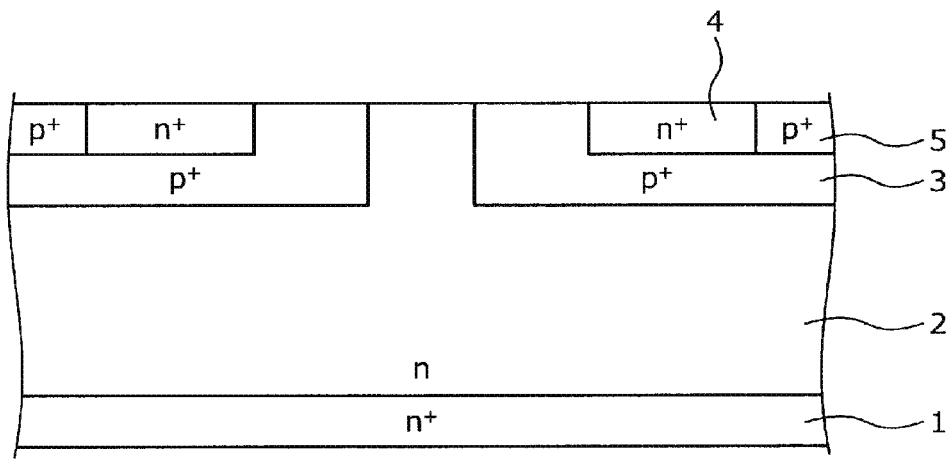
FIG. 6 is a cross-sectional view illustrating a third state during manufacture of the silicon carbide semiconductor device according to the embodiment.

Next, using photolithography and ion implantation, an n⁺ source region 4 is selectively formed in the surface layer of the p-type base layer 3. Then, using photolithography and ion implantation, a p⁺ contact region 5 is selectively formed in the surface layer of the p-type base layer 3. FIG. 6 illustrates the resulting structure at this point.

A heat treatment (annealing) for activating the p-type base layer 3, the $n^+$ source region 4, and the $p^+$ contact region 5 is performed. The temperature and duration of this heat treatment may respectively be 1620° C. and 10 minutes.

The order in which the p-type base layer 3, the $n^+$ source region 4, and the $p^+$ contact region 5 are formed can be changed in various ways.

Subsequently, the front surface side of the silicon carbide semiconductor substrate is thermally oxidized to form a gate insulating film 6 with a thickness of 100 nm. This thermal oxidation process may be performed by applying a heat treatment at a temperature of approximately 1000° C. in a mixed atmosphere of oxygen ($O_2$) and hydrogen ($H_2$). In this way, the regions formed in the surfaces of the p-type base layer 3 and the n-type silicon carbide epitaxial layer 2 are covered by the gate insulating film 6.

Subsequently, a polycrystalline silicon layer (polysilicon (poly-Si) layer) doped with phosphorus (P) or boron (B), for example, is formed as a gate electrode 7 on the gate insulating film 6. Then, the polycrystalline silicon layer is selectively removed using a patterning process, thereby leaving the polycrystalline silicon layer remaining on the portions of the p-type base layer 3 sandwiched between the $n^+$ source region 4 and the JFET region 11. Here, the polycrystalline silicon layer may also be left remaining on the JFET region 11.

Next, a phosphosilicate glass (PSG) film, for example, as an interlayer insulating film is formed so as to cover the gate insulating film 6. The thickness of the interlayer insulating film may be 1.0 μm. Subsequently, the interlayer insulating film and the gate insulating film 6 are selectively removed using a patterning process to form contact holes, thereby exposing the $n^+$ source region 4 and the $p^+$ contact region 5. Then, a heat treatment (reflow) is performed to planarize the interlayer insulating film.

Figure 7:
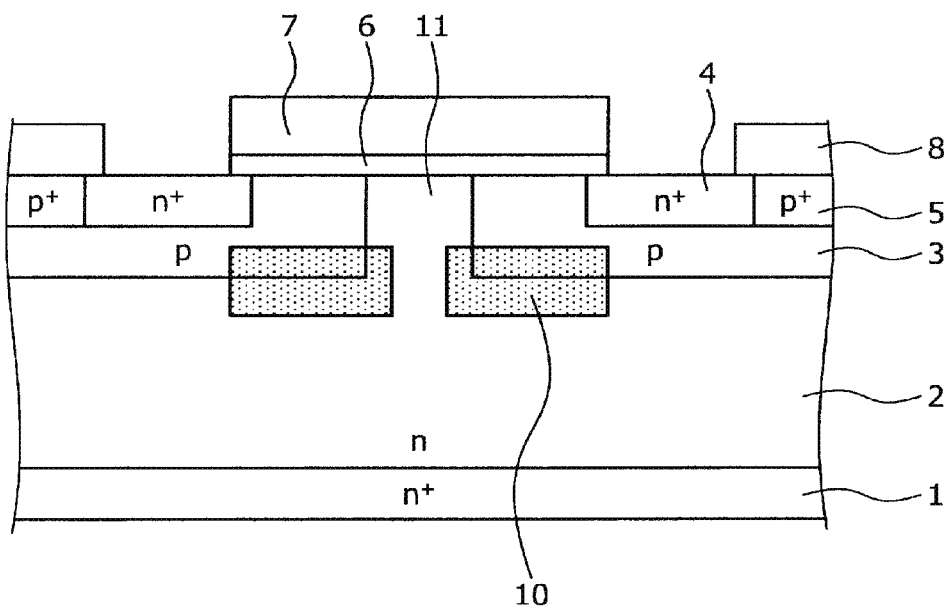
FIG. 7 is a cross-sectional view illustrating a fourth state during manufacture of the silicon carbide semiconductor device according to the embodiment.

Thereafter, a source electrode 8 is formed as a film on the surface of the interlayer insulating film. Here, the source electrode 8 is also embedded in the contact holes, thereby bringing the source electrode 8 into contact with the $n^+$ source region 4 and the $p^+$ contact region 5. The portions of the source electrode 8 on top of the interlayer insulating film may have a thickness of 5 μm, for example. Moreover, the source electrode 8 may be made of aluminum containing 1% silicon (Al—Si), for example. Next, the source electrode 8 is selectively removed except for in the contact holes. FIG. 7 illustrates the resulting structure at this point.

Subsequently, a nickel film, for example, is formed as a drain electrode 9 on the surface of the $n^+$ silicon carbide substrate 1 (that is, on the rear surface of the silicon carbide semiconductor substrate). Then, a heat treatment is performed at a temperature of 970° C., for example, to form an ohmic contact between the $n^+$ silicon carbide substrate 1 and the drain electrode 9. Next, using a sputtering process, for example, an electrode layer is deposited over the entire front surface of the silicon carbide semiconductor substrate so as to cover the source electrode 8 and the interlayer insulating film. The portions of the electrode layer on top of the interlayer insulating film may have a thickness of 5 μm, for example. The electrode layer may be made of aluminum containing 1% silicon (Al—Si), for example. Then, the electrode layer is selectively removed to form an electrode pad connecting to the source electrode 8.

Next, titanium (Ti), nickel (Ni), and gold (Au) films, for example, are formed as a drain electrode pad in that order on the surface of the drain electrode 9. Then, a protective film may be formed on the surface.

In this embodiment, lifetime killers are implanted in a region at and adjacent to the interface between the n-type silicon carbide epitaxial layer 2 and the p-type base layer 3 that faces the gate insulating film 6, thereby forming lifetime killer regions 10. The lifetime killer region 10 is formed by, for example, using photolithography and etching to form an ion implantation oxide film mask and then ion-implanting helium or protons from the rear surface side of the silicon carbide semiconductor substrate. It is preferable that this lifetime killer regions 10 be formed prior to forming the drain electrode 9. Moreover, the lifetime killers may be implanted from the front surface side of the silicon carbide semiconductor substrate, in which case it is preferable that this be done prior to forming the gate electrode 7. In the above manner, the MOSFET illustrated in FIG. 1 is completed.

Figure 8:
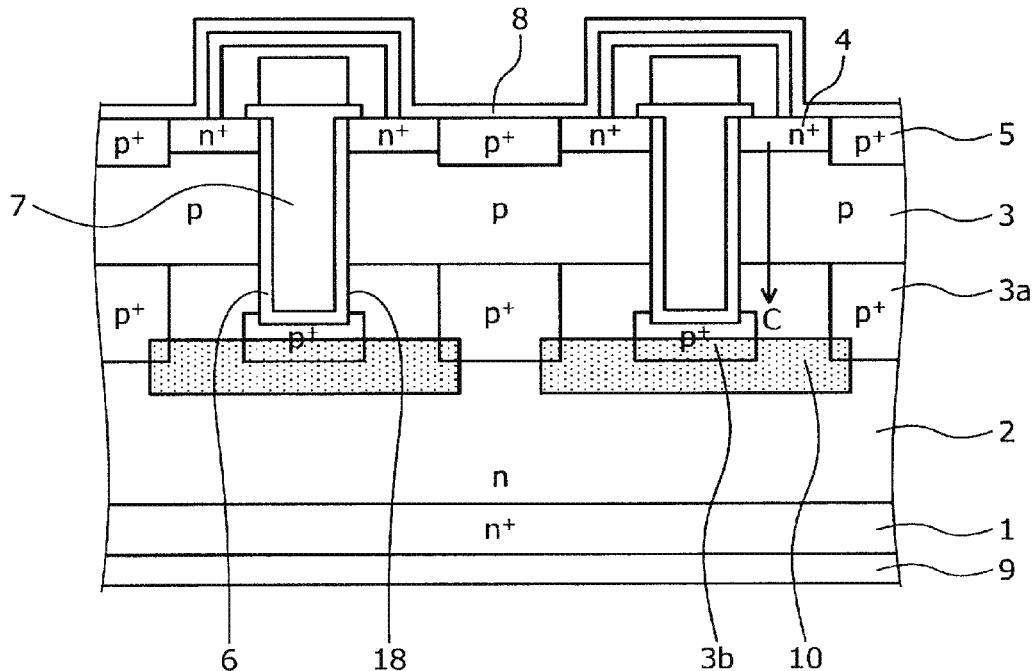
FIG. 8 is a first cross-sectional view illustrating the structure for a silicon carbide semiconductor device according to another embodiment.
Figure 9:
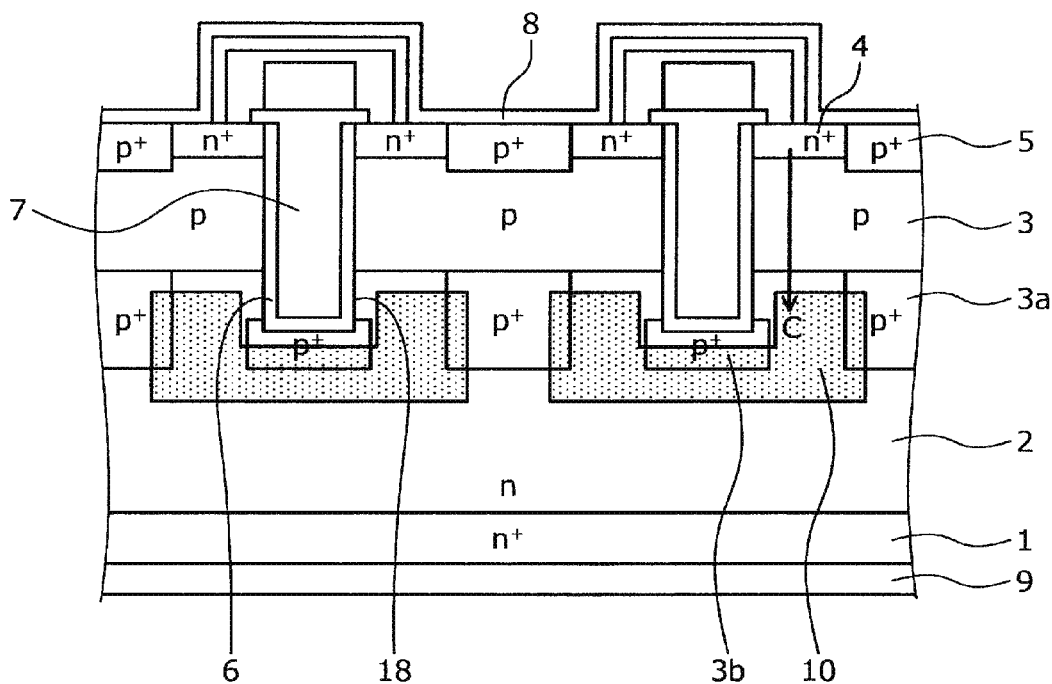
FIG. 9 is a second cross-sectional view illustrating the structure for a silicon carbide semiconductor device according to another embodiment.
Figure 10:
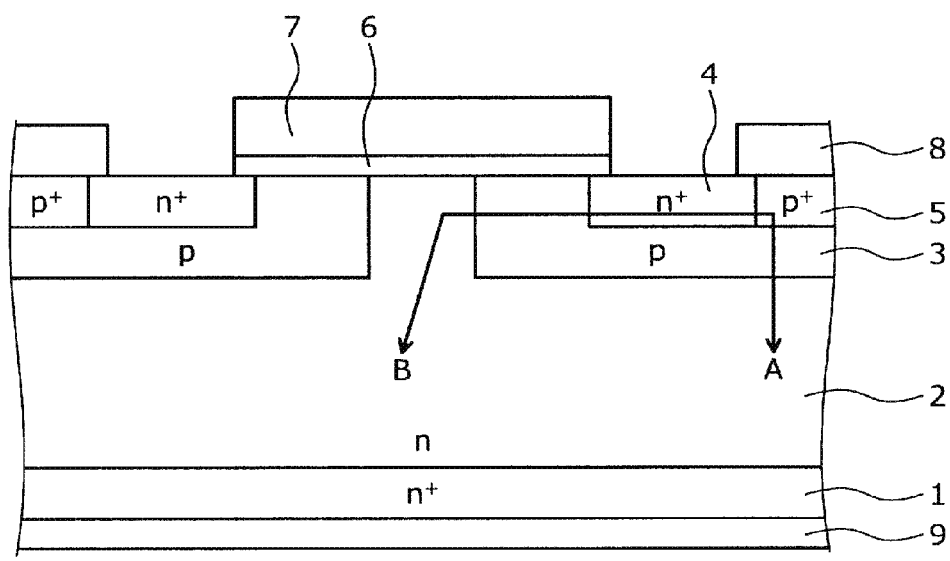
FIG. 10 is a cross-sectional view illustrating the structure of a conventional vertical SiC MOSFET.

FIGS. 8 and 9 are cross-sectional views illustrating other structures for the silicon carbide semiconductor device according to other embodiments. FIGS. 8 and 9 illustrate vertical MOSFETs having a trench structure. In vertical MOSFETs, a trench structure in which a channel is formed orthogonal to the substrate surface makes it possible to achieve a higher cell density per unit area than in a planar structure in which a channel is formed parallel to the substrate surface. This makes it possible to increase the current density per unit area and is advantageous from a cost perspective.

In FIGS. 8 and 9, the trench structures are formed on the first principal surface side (the p-type base layer 3 side) of the silicon carbide semiconductor substrate. More specifically, trenches 18 are formed going from the surface of the p-type base layer 3 on the side opposite to the $n^+$ silicon carbide substrate 1 side (that is, from the first principal surface side of the silicon carbide semiconductor substrate) through the p-type base layer 3 and reaching the n-type silicon carbide epitaxial layer 2. A gate insulating film 6 is formed along the inner walls of each trench 18 (that is, on the bottom and the sidewalls of the trench 18), and a gate electrode 7 is formed on the inner side of the gate insulating film 6 inside each trench 18. The gate electrode 7 is insulated from the n-type silicon carbide epitaxial layer 2 and the p-type base layer 3 by the gate insulating film 6. A portion of each gate electrode 7 may protrude upward from the top of each trench 18 (that is, the side on which a source electrode pad will be formed) towards the source electrode pad side.

First $p^+$ base regions 3a are selectively formed in the surface of the n-type silicon carbide epitaxial layer 2 on the side opposite to the $n^+$ silicon carbide substrate 1 side. The first $p^+$ base regions 3a extend down to a deeper position on the drain side than the bottoms of the trenches 18. The bottom ends (that is, the drain-side ends) of the first $p^+$ base regions 3a are positioned further towards the drain side than the bottoms of the trenches 18.

Moreover, second $p^+$ regions 3b are selectively formed in the n-type silicon carbide epitaxial layer 2. The second $p^+$ regions 3b are formed so as to contact the bottoms of the trenches 18. The second $p^+$ regions 3b are formed extending from a position deeper towards the drain side than the interface between the p-type base layer 3 and the n-type silicon carbide epitaxial layer 2 to a depth that does not reach the interface between the $n^+$ silicon carbide substrate 1 and the n-type silicon carbide epitaxial layer 2.

Furthermore, lifetime killer regions 10 are formed further towards the drain side than the trenches 18 and so as to span adjacent first $p^+$ base regions 3a. Here, although it is preferable that the lifetime killer regions 10 not be present in the regions facing the p$^+$ contact regions 5 in the depth direction, the lifetime killer regions 10 may be arranged such that the edges thereof overlap with the p$^+$ contact regions 5 when viewed in a plan view. Moreover, it is preferable that the lifetime killer regions 10 not contact the trenches 18. The lifetime killer regions 10 may be extended towards the n$^+$ source region 4 side and may contact the n$^+$ source regions 4. For example, the lifetime killer regions 10 may be configured as illustrated in FIG. 9. In addition, the lifetime killer regions 10 may be extended towards the n$^+$ silicon carbide substrate 1 side and may contact the n$^+$ silicon carbide substrate 1.

The other structures in the MOSFETs illustrated in FIGS. 8 and 9 are the same as the structures in the MOSFET illustrated in FIG. 1 and therefore will not be described here. Moreover, except for the steps of forming the trenches 18, the gate insulating film 6, and the gate electrodes 7, a method of manufacturing the MOSFETs illustrated in FIGS. 8 and 9 is the same as the method of manufacturing the MOSFET illustrated in FIG. 1, and therefore a detailed description will be omitted here. Here, the trenches 18, the gate insulating film 6, and the gate electrodes 7 are formed as described below, for example.

First, using a photolithography technology, a mask (not illustrated in the figures) having the desired openings and made of an oxide film, for example, is formed on the surface of the p-type base layer 3 (that is, on the surfaces of the n$^+$ source regions 4 and the p$^+$ contact regions 5). Then, using a dry etching process or the like with the oxide film being used as a mask, the trenches 18 are formed going through the n$^+$ source regions 4 and the p-type base layer 3 and reaching the n-type silicon carbide epitaxial layer 2.

Next, the gate insulating film 6 is formed along the surfaces of the n$^+$ source regions 4 and the p$^+$ contact regions 5 and along the bottoms and sidewalls of the trenches 18. The gate insulating film 6 may be formed using a thermal oxidation process in which a heat treatment is performed in an oxygen atmosphere at a temperature of approximately 1000° C. Alternatively, the gate insulating film 6 may be formed using a deposition process based on a chemical reaction such as high temperature oxidation (HTO).

Subsequently, a polycrystalline silicon layer doped with phosphorus atoms, for example, is formed on the gate insulating film 6. This polycrystalline silicon layer is formed so as to fill the trenches 18. The polycrystalline silicon layer is then patterned and left remaining only inside the trenches 18 to form the gate electrodes 7.

Similar to in the MOSFET illustrated in FIG. 1, in the MOSFETs illustrated in FIGS. 8 and 9, the lifetime killer regions 10 reduce the number of minority carriers and thereby reduce the current that passes near the gate electrodes 7 and flows through the p-n junctions between the p-type base layer 3 and the n-type silicon carbide epitaxial layer 2 (illustrated by C in FIGS. 8 and 9, for example).

In the semiconductor device according to the embodiments as described above, a lifetime killer region having implanted therein a lifetime killer which serves as a recombination center for minority carriers is formed. Therefore, when a high voltage is applied to the source electrode to drive the built-in p-n diode, the current that flows through the p-n junction between the p-type base layer and the n-type silicon carbide epitaxial layer directly beneath the gate electrode is reduced, thereby making it possible to reduce formation of crystal defects in the n$^+$ silicon carbide substrate and the n-type silicon carbide epitaxial layer. As a result, the ON-resistance of the semiconductor device does not increase due to such crystal defects, which makes it possible to reduce fluctuations in the threshold voltage Vth of the MOSFET and the forward voltage Vf of the built-in p-n diode and also makes it possible to maintain the reliability of the semiconductor device.

Various modifications can be made to the present invention as described above without departing from the spirit of the present invention. For example, the dimensions, impurity concentrations, and the like of each portion of the device in the embodiments described above can be configured in various ways in accordance with design requirements or the like. Moreover, although the embodiments above were described as being MOSFETs as an example, the present invention is not limited to this example and is widely applicable to various types of silicon carbide semiconductor devices that conduct and block current when gate-controlled on the basis of a prescribed gate threshold voltage. For example, the present invention can be applied to an IGBT by using a semiconductor substrate of a different conductivity type than that in a MOSFET. Furthermore, although the embodiments above were described using examples in which silicon carbide was used as the wide-bandgap semiconductor, the present invention can also be applied when using a wide-bandgap semiconductor other than silicon carbide such as gallium nitride (GaN), for example. Moreover, although in the embodiments above the first conductivity type was n-type and the second conductivity type was p-type, the present invention still exhibits all of the same advantageous effects when the first conductivity type is p-type and the second conductivity type is n-type.

As described above, the semiconductor device and the method of manufacturing the semiconductor device according to the present invention are suitable for use in high breakdown voltage semiconductor devices used in power converters, power supplies for various types of industrial machinery or the like, and the like.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a semiconductor substrate of a first conductivity type;
   a first semiconductor layer of the first conductivity type formed on a front surface of the semiconductor substrate and having a lower impurity concentration than the semiconductor substrate;
   a second semiconductor layer of a second conductivity type selectively formed in a surface layer of the first semiconductor layer on a side opposite to a side of the semiconductor substrate;
   a first semiconductor region of the first conductivity type selectively formed in a surface layer of the second semiconductor layer on a side opposite to the semiconductor substrate side;
   a second semiconductor region of the second conductivity type selectively formed in the surface layer of the second semiconductor layer on the side opposite to the semiconductor substrate side and having a higher impurity concentration than the second semiconductor layer;
   a gate electrode formed on a face of a region of the second semiconductor layer that is sandwiched between the first semiconductor layer and the first semiconductor region, with a gate insulating film interposed therebeneath;

a first electrode formed on surfaces of the second semiconductor region and the first semiconductor region;

a second electrode formed on a rear surface of the semiconductor substrate; and a lifetime killer region that has lifetime killers implanted therein and that is selectively formed in a region of the first semiconductor layer that crosses a p-n junction formed by the first semiconductor layer of the first conductivity type and a region of the second conductivity type created therein, the lifetime killer region not substantially overlapping the second semiconductor region in a plan view except lateral edges thereof.

2. The semiconductor device according to claim 1, wherein said face of said region of the second semiconductor layer that is sandwiched between the first semiconductor layer and the first semiconductor region is a horizontal surface that is flush with a top surface of the first semiconductor layer, and wherein said p-n junction is defined by an interface between the first semiconductor layer and the second semiconductor layer.

3. The semiconductor device according to claim 1, further comprising:

a trench going through the second semiconductor layer and reaching the first semiconductor layer, a vertical sidewall of said trench exposing said face of said region of the second semiconductor layer that is sandwiched between the first semiconductor layer and the first semiconductor region, wherein the gate electrode is formed inside the trench across said face of said region of the second semiconductor layer with the gate insulating film interposed therebetween, and wherein said p-n junction is defined by an interface between the first semiconductor layer and a third semiconductor region of the second conductivity that is formed to extend downwardly into the first semiconductor layer from a bottom of the second semiconductor layer and that has a higher impurity concentration than the second semiconductor layer.

4. The semiconductor device according to claim 2, wherein the lifetime killer region is formed in a region of the first semiconductor layer that faces the gate insulating film.

5. The semiconductor device according to claim 2, wherein a bottom of the lifetime killer region is positioned further towards the semiconductor substrate side than an interface between the first semiconductor layer and the second semiconductor layer.

6. The semiconductor device according to claim 5, wherein the bottom of the lifetime killer region contacts the semiconductor substrate.

7. The semiconductor device according to claim 3, wherein a bottom of the lifetime killer region is positioned further towards the semiconductor substrate side than an interface between the first semiconductor layer and the second semiconductor layer.

8. The semiconductor device according to claim 7, wherein the bottom of the lifetime killer region contacts the semiconductor substrate.

9. The semiconductor device according to claim 1, wherein an upper boundary of the lifetime killer region is positioned further towards a side of the gate insulating film than a bottom of the second semiconductor layer that contacts the first semiconductor layer.

10. The semiconductor device according to claim 2, wherein an upper boundary of the lifetime killer region is positioned at an interface between the first semiconductor layer and the gate insulating film.

11. The semiconductor device according to claim 1, wherein the lifetime killer region includes helium or protons.

12. A method of manufacturing a semiconductor device, comprising:

forming, on a front surface of a semiconductor substrate of a first conductivity type, a first semiconductor layer of the first conductivity type and having a lower impurity concentration than the semiconductor substrate;

selectively forming a second semiconductor layer of a second conductivity type in a surface layer of the first semiconductor layer on a side opposite to a side of the semiconductor substrate;

selectively forming a first semiconductor region of the first conductivity type in a surface layer of the second semiconductor layer on a side opposite to the semiconductor substrate side;

selectively forming a second semiconductor region of the second conductivity type and having a higher impurity concentration than the second semiconductor layer in the surface layer of the second semiconductor layer on the side opposite to the semiconductor substrate side;

forming a gate electrode on a face of a region of the second semiconductor layer that is sandwiched between the first semiconductor layer and the first semiconductor region, with a gate insulating film interposed therebetween;

forming a first electrode on surfaces of the second semiconductor region and the first semiconductor region; and forming a lifetime killer region by selectively implanting lifetime killers in a region of the first semiconductor layer that crosses a p-n junction formed by the first semiconductor layer of the first conductivity type and a region of the second conductivity type created therein, the lifetime killer region not substantially overlapping the second semiconductor region in a plan view except lateral edges thereof.

13. The method of manufacturing the semiconductor device according to claim 12, wherein the second semiconductor layer is formed such that said face of said region of the second semiconductor layer that is sandwiched between the first semiconductor layer and the first semiconductor region is a horizontal surface that is flush with a top surface of the first semiconductor layer, and wherein said p-n junction is defined by an interface between the first semiconductor layer and the second semiconductor layer.

14. The method of manufacturing the semiconductor device according to claim 12, further comprising, after forming the second semiconductor region and before forming the gate electrode:

forming a trench going through the second semiconductor layer and reaching the first semiconductor layer, a vertical sidewall of said trench exposing said face of said region of the second semiconductor layer that is sandwiched between the first semiconductor layer and the first semiconductor region, wherein in forming the gate electrode, the gate electrode is formed inside the trench across said face of said region of the second semiconductor layer with the gate insulating film interposed therebetween, and wherein said p-n junction is defined by an interface between the first semiconductor layer and a third semiconductor region of the second conductivity that is formed to extend downwardly into the first semiconductor layer from a bottom of the second semiconductor layer and that has a higher impurity concentration than the second semiconductor layer.

* * * * *